US006795931B1

(12) United States Patent
LaBerge

(10) Patent No.: US 6,795,931 B1
(45) Date of Patent: Sep. 21, 2004

(54) METHOD AND APPARATUS FOR AN ADJUSTABLE DELAY CIRCUIT HAVING ARRANGED SERIALLY COARSE STAGES RECEIVED BY A FINE DELAY STAGE

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/409,367

(22) Filed: Sep. 30, 1999

(51) Int. Cl.[7] .............................. G06F 1/12; H04L 5/00; H03H 11/00
(52) U.S. Cl. ....................... 713/401; 713/400; 327/149; 327/161; 327/261; 327/276
(58) Field of Search ................................. 713/400, 401; 327/149, 161, 261, 276

(56) References Cited

U.S. PATENT DOCUMENTS

| | | | | |
|---|---|---|---|---|
| 5,210,450 A | * | 5/1993 | Parkinson | 327/269 |
| 5,258,660 A | * | 11/1993 | Nelson et al. | 327/141 |
| 5,293,626 A | * | 3/1994 | Priest et al. | 713/401 |
| 5,727,021 A | * | 3/1998 | Truebenbach | 714/700 |
| 5,963,074 A | * | 10/1999 | Arkin | 327/276 |
| 6,060,928 A | * | 5/2000 | Jun et al. | 327/261 |
| 6,222,407 B1 | * | 4/2001 | Gregor | 327/269 |

FOREIGN PATENT DOCUMENTS

JP    10190423 A  *  7/1998  ............ H03K/5/13

OTHER PUBLICATIONS

Sakamoto, K.; McDonald, J.; Swapp, M.; Weir, B.; "A digitally programmable delay chip with picosecond resolution", Bipolar Circuits and Technology Meeting, 1989., Proceedings of the 1989, Sep. 18–19, 1989, Page(s): 295–297.*

* cited by examiner

Primary Examiner—Thomas Lee
Assistant Examiner—James K. Trujillo
(74) Attorney, Agent, or Firm—Trop, Pruner & Hu, P.C.

(57) ABSTRACT

A programmable delay circuit having a plurality of course delay stages (coupled in series fashion) and a fine delay stage having a plurality of parallel organized delay paths is described, wherein each of the parallel organized delay paths is adapted to receive input from a common course delay stage and to delay a signal for a different specified amount of time. The programmable delay circuit may provide a relatively large overall signal delay (provided primarily by the course delay stages), while also providing a fine temporal resolution (provided primarily by the fine delay stage).

22 Claims, 6 Drawing Sheets

METHOD AND APPARATUS FOR AN ADJUSTABLE DELAY CIRCUIT HAVING ARRANGED SERIALLY COARSE STAGES RECEIVED BY A FINE DELAY STAGE

BACKGROUND

The invention relates generally to electronic delay lines and, more particularly but not by way of limitation, to the design of adjustable delay lines.

Delay lines are often used by design engineers to adjust the timing of various events in an electronic system. For example, delay lines may be used to adjust or set sampling times in high-speed analog and digital circuits.

A trend in the field of computer system design is the use of source-strobed interfaces. In a source-strobed interface, that component sourcing (transmitting) data also generates and transmits a strobe signal that is used by the receiving component to capture or latch the data. One source-strobed interface is that used by double data rate (DDR) dynamic random access memory devices. (The DDR standard is available from the Joint Electron Device Engineering Counsel as document JESD-21-C.) Memory interface circuits designed to work with Synchlink and RAMBUS® memory devices are also source-strobed. (A standard defining Synchlink memory has been assigned the tentative designation of IEEE-1596.7 by the Institute of Electrical and Electronics Engineers. The RAMBUS® standard is published by Rambus, Incorporated of Mountain View, Calif.) Another interface making use of source-strobed techniques is the accelerated graphics port (AGP) interface. (The Accelerated Graphics Port Interface Specification, Rev. 2.0, May 1998, is available from Intel Corporation.)

Referring to FIG. 1, source-strobed interface 100 includes circuit A 102, circuit B 104 (either or both of which may act as a transmitter and receiver of data), data path 106 and strobe path 108. To ensure that data 110 is reliably captured, it is important that the strobe signal's rising edge 112 (and/or falling edge 114) occur as close—in time—to the data signal's center 116 as possible. Thus, for optimal performance a source-strobed interface receiver (e.g., circuit B 104) designed to capture data signal 110 on the strobe signal's rising edge 112 would delay the strobe signal's rising edge 112 by an amount of time indicated by 118; effectively shifting the strobe's latching edge into the center of data signal 110 (the "data eye").

Current embodiments of DDR interfaces operate at 133 MHz (megahertz) to provide a 266 MHz data transfer rate. At these frequencies data strobe 108 has a period of approximately 7.5 nsec (nanoseconds). Due to the allowed timing tolerances between data signal 106 and strobe signal 108, strobe signal 108 may typically need to be delayed up to approximately one-quarter period or 1.5 to 2.0 nsec. Similar delay periods may be required by Synchlink, RAMBUS® and AGP interface circuitry.

Prior art digital delay lines have typically been designed using inverter chains (inverter units coupled in series) to introduce signal delay and multiplexer trees (multiplexer units arranged in a tiered fashion) to perform selection of the appropriately delayed signal. Referring to FIG. 2, for example, delay line 200 uses inverter chain 202 to generate a sequence of signals, each a differently delayed version of input signal 204 (output from each inverter unit represents a delayed version of its input signal). Multiplexer tree 206 selectively routes (under control of select signal 208) one of the delayed versions of input signal 204 to output port 210. During delay line setup and/or run-time operations, select signal 208 may be modified to route a different delayed version of input signal 204 to output port 210.

Intrinsic delay times through conventional inverter/buffer elements used in semiconductor devices (e.g., standard cell modules used by custom semiconductor device design tools) such as delay line 200 are in the range of 45 to 80 nsec. Thus, it is often difficult to design a delay circuit having the resolution required by current source-strobed interfaces (e.g., in the range of 10 to a few 100 picoseconds). In addition, the use of multiplexer trees complicates delay line design because each leg through a multiplexer typically has a different inherent delay. These differences must be accommodated in the delay line's ultimate design, often requiring custom layout of each multiplexer unit.

Thus, there is a need for digital delay lines that provide the ability to adjustably delay a signal with a resolution in the range of one to a few hundred picoseconds, are relatively immune to the delay introduced by different legs of a multiplexer (or other signal selection circuit). There is a further need for an adjustable digital delay line providing these benefits that may be constructed from standard cell elements (e.g., buffers, inverters and multiplexer units).

SUMMARY

In one embodiment the invention provides a programmable delay circuit that includes a plurality of coarse delay stages (coupled in series fashion) and a fine delay stage having a plurality of parallel organized delay paths. Each of the parallel organized delay paths is adapted to receive input from a common coarse delay stage and to delay a signal for a different specified amount of time. Programmable delay circuits in accordance with the invention may provide a relatively large overall signal delay (provided primarily by the coarse delay stages), while also providing a fine temporal resolution (provided primarily by the fine delay stage). Illustrative uses for a delay circuit in accordance with the invention include, but are not limited to, source-strobed interfaces.

DETAILED DESCRIPTION

A programmable delay circuit for providing a relatively large overall signal delay and a fine temporal resolution to that delay is described. The following embodiments of the invention, described in terms of a semiconductor implementation using standard cell components for a source-strobed interface, are illustrative only and are not to be considered limiting in any respect.

Figure 3:
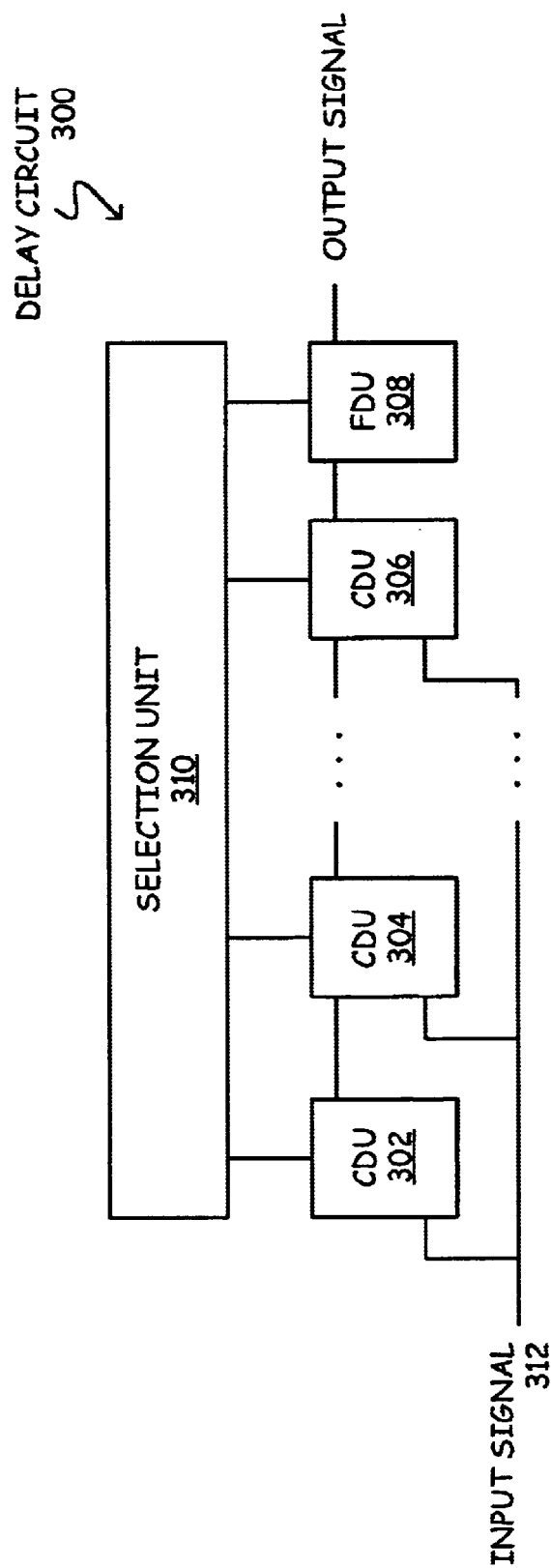
FIG. 3 shows a block diagram of a programmable delay circuit in accordance with the invention.

Referring to FIG. 3, a block diagram of programmable delay circuit 300 in accordance with the invention includes one or more coarse delay units coupled in series (302, 304 and 306), fine delay unit 308 coupled to the last coarse delay unit 306 and selection unit 310. Each coarse delay unit is configured to introduce a fixed delay. In one embodiment, each coarse delay unit introduces a substantially equal delay time on the order of hundreds of picoseconds (psec). In another embodiment, each coarse delay unit (e.g., unit 302) introduces a longer (or shorter) delay than the unit that follows it (e.g., unit 304). Fine delay unit 308 provides a plurality of parallel organized signal paths, each of which is configured to delay an input signal for a different amount of time. In one embodiment, the delay time difference between different signal paths within fine delay unit 308 is on the order of a few picoseconds to hundreds of picoseconds. Selection unit 310 adjustably selects one signal path through which input signal 312 is routed; the selected path providing the desired signal delay.

Figure 4:
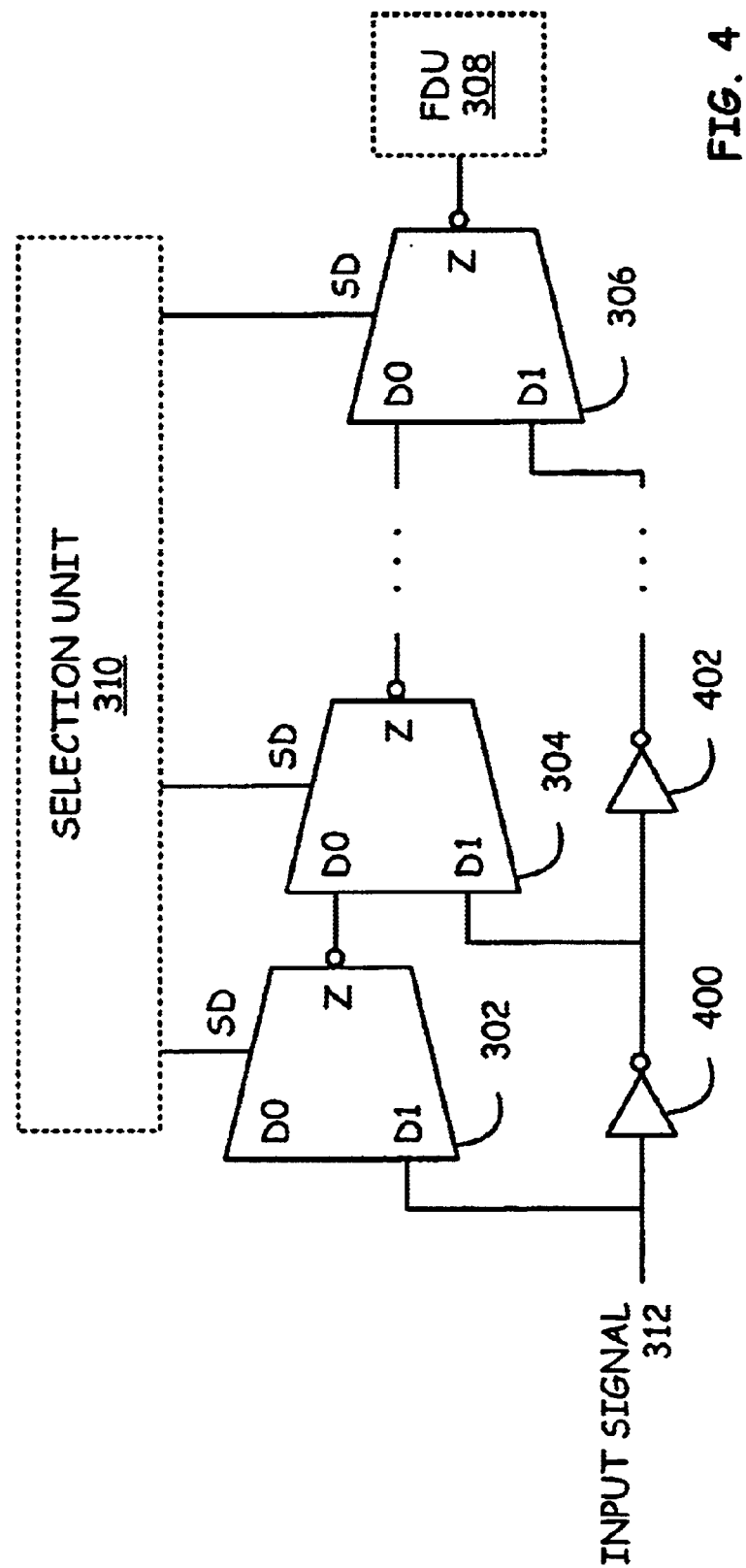
FIG. 4 shows a schematic block diagram for one embodiment of the coarse delay units of FIG. 3.

In one embodiment, each coarse delay unit comprises an inverting multiplexer (MUX) such as the 2:1 MUX provided by Lucent Technologies of Murray Hill, N.J. (designated MUX21I) as part of their 2.5 volt, 0.25 micron complementary metal-oxide semiconductor (CMOS) standard cell library. Referring to FIG. 4, for example, coarse delay units 302, 304 and 306 may be implemented using MUX21I devices. As an implementation issue, when inverting devices (e.g., MUXs' 302, 304 and 306) are used it is beneficial to also incorporate inverting buffers (e.g., 400 and 402) in the path of input signal 312. Signal path buffers 400 and 402 provide load isolation to the circuit driving input signal 312 as well as matching the input signal edge reaching each MUX unit's D0 and D1 inputs. As shown, each MUX unit includes one control input port (SD), two data input ports (D0 and D1) and one data output port (Z). Intrinsic delay through a MUX21I unit's D0 to Z path is between approximately 91 and 122 psec, and between approximately 86 and 125 psec when passing from input port D1 to output port Z.

Control input SD (provided by selection unit 310) determines which input port's applied signal is routed through the MUX. If control input SD is asserted high, the signal at output port Z is an inverted version of the signal applied to input port D0. Similarly, if control input SD is asserted low, the signal at output port Z is an inverted version of that signal applied to input port D1. In operation, one MUX unit is selected to route input signal 312 from its D1 input port to its Z output port. The MUX unit so selected represents the initial or first input stage. Other MUX (coarse delay) units are selected to route signals from their D0 input port to their Z output port relaying and delaying input signal 312 from one stage to the next. In this manner, input signal 312 passes through the same leg of all MUX units except one. This arrangement reduces the delay variation caused by a signal passing through different legs of a MUX.

The number of coarse delay units to include in delay circuit 300 depends upon the magnitude of the desired delay. For example, if a maximum delay of 2.0 nsec are needed and MUX21I units are used to introduce approximately 200 psec per stage (see discussion above), then approximately 10 coarse delay stages may be needed. In one embodiment where delay circuit 300 is one element in a memory control device's double data rate (DDR) memory interface, delay circuit 300 may include between 24 and 32 stages. Other embodiments may utilize more or fewer stages. In addition, supplemental loads may be used between individual coarse delay stages (e.g., between the Z output port of one MUX and the D0 data input port of a second MUX) to ensure the delay through each coarse stage is equal; that is, to "tune" the delay through each stage. In addition, when inverting devices are used to implement coarse delay units, additional loading may be beneficial to compensate for the differences in delay time associated with operations driving by rising and falling edges.

It is envisioned, though not required, that elements used to implement coarse delay stages provide more drive capability than necessary to propagate input signal 312. When this is true, it is generally acceptable to use automated layout tools (typically part of a custom semiconductor design tool). That is, little or no custom layout and/or balancing of the coarse delay stages is necessary. This feature, in turn, improves the speed with which delay circuit 300 may be designed while also reducing the number of errors that may be introduced during custom layout operations (through human error).

Figure 1:
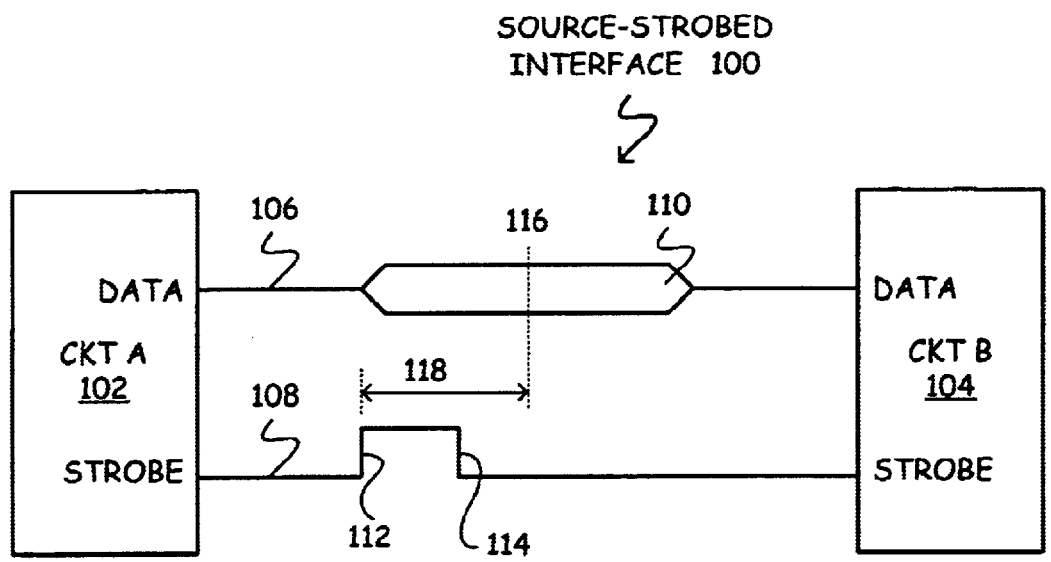
FIG. 1 shows a prior art source-strobed interface including data and strobe signals.
Figure 5:
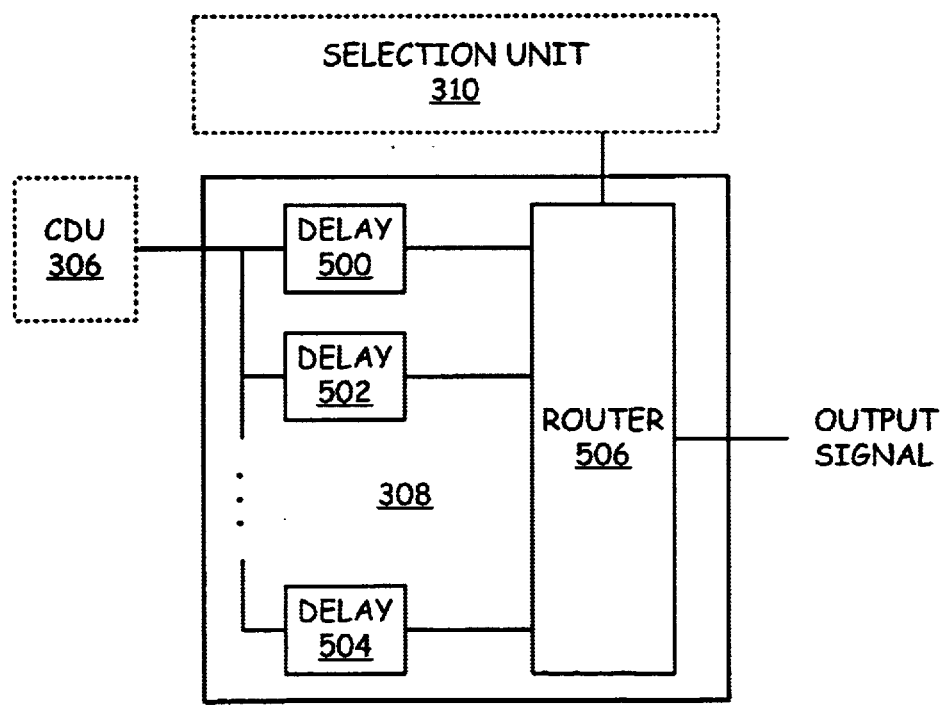
FIG. 5 shows a block diagram of a fine delay unit in accordance with one embodiment of the invention.

Referring to FIG. 5, fine delay unit 308 includes a plurality of parallel organized delay elements 500, 502 and 504 and a signal routing element 506. As shown, each delay element receives input from the last coarse delay unit 306 and is designed to provide a specified different delay. For example, in one embodiment element 500 provides a delay of 50 psec, element 502 100 psec, a third element (not shown in FIG. 5) 150 psec, and element 504 200 psec. If delay element 500 is designated as the "zero delay" path, fine delay unit 308 provides the ability to selectively delay a signal from 0 to 150 psec steps of 50 psec.

Figure 2:
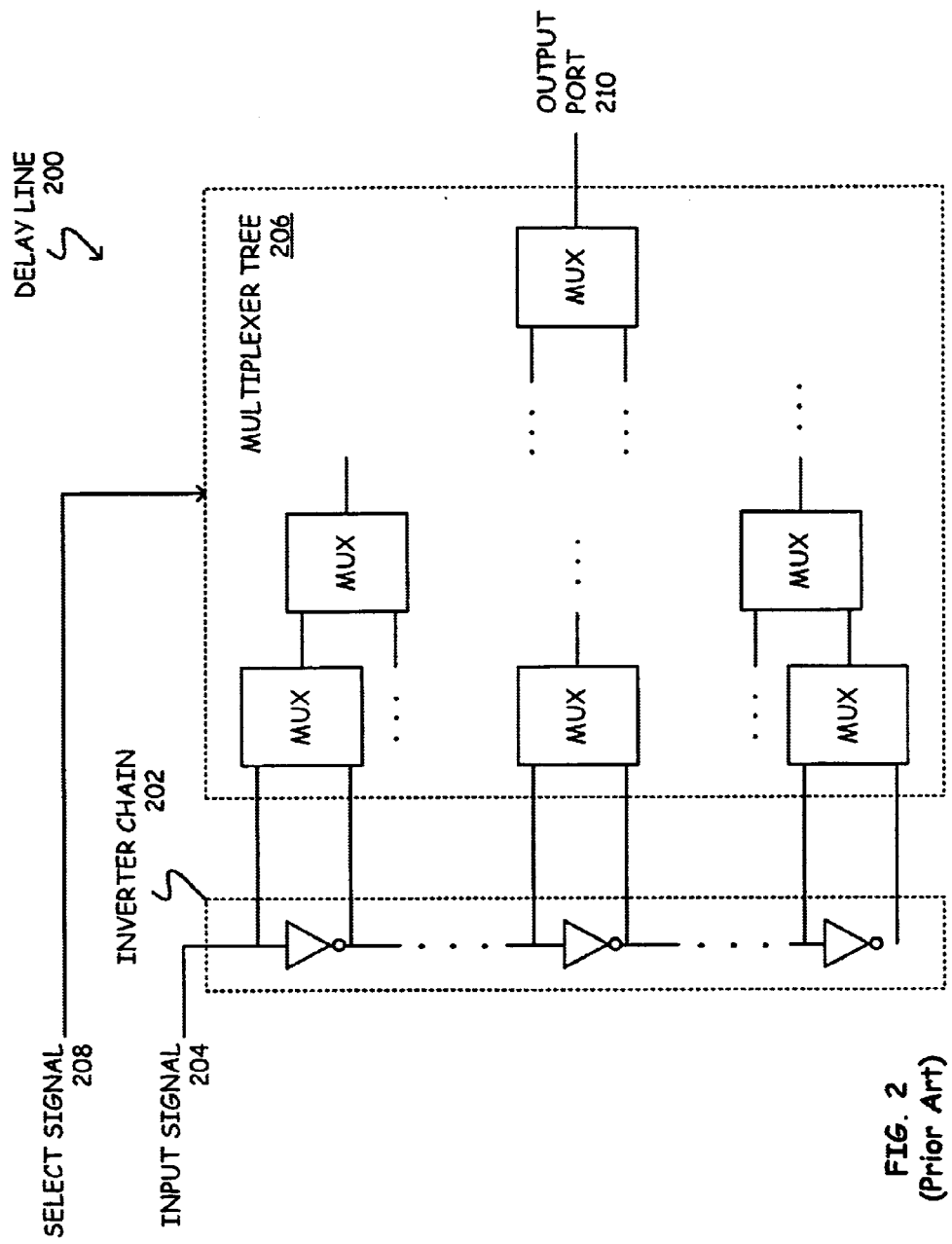
FIG. 2 shows a prior art adjustable delay line employing an inverter chain and multiplexer tree selection circuitry.
Figure 6:
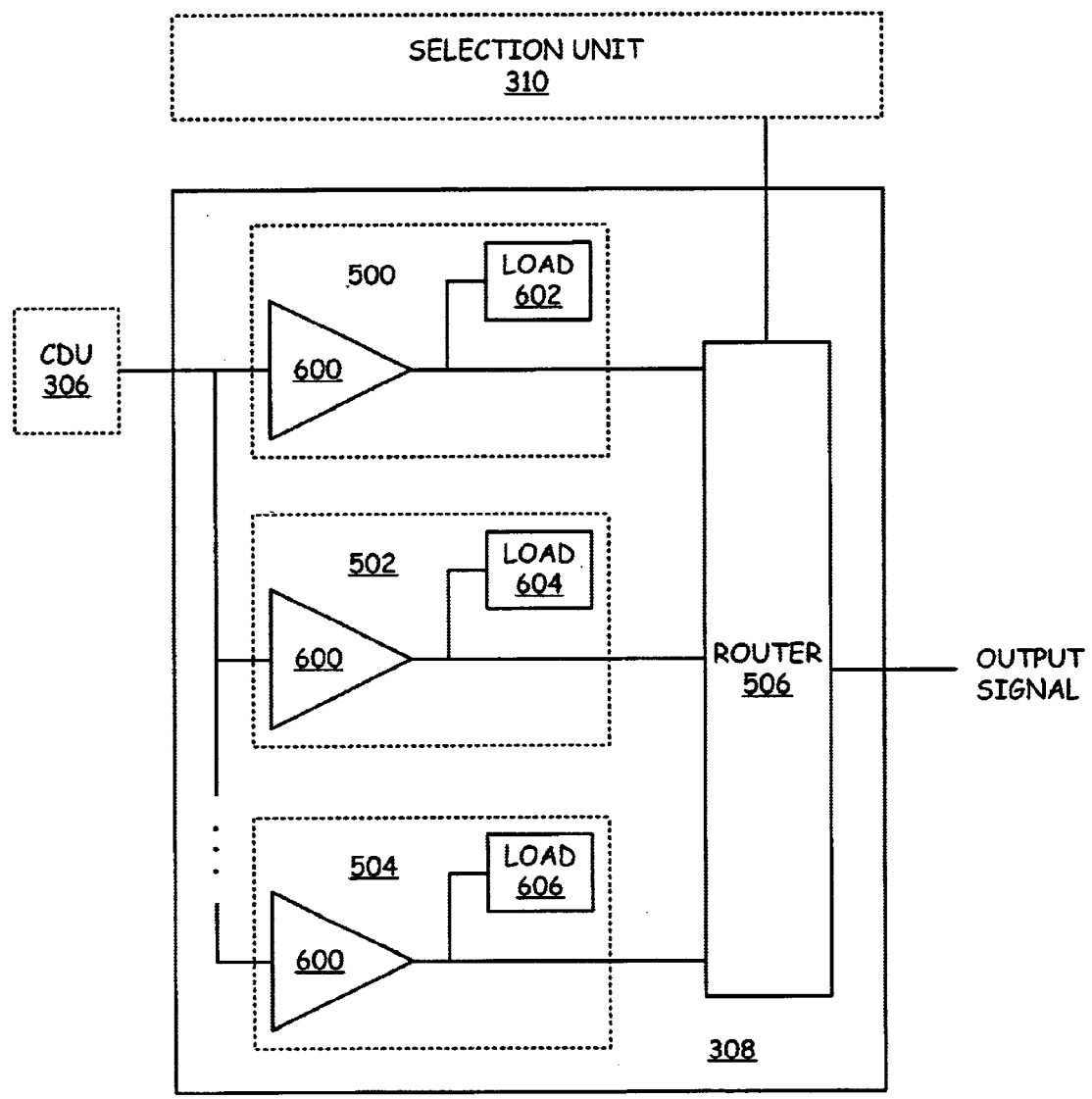
FIG. 6 shows an expanded block diagram of the fine delay unit of FIG. 5.

To achieve a fine temporal resolution (e.g., 50 psec), it is not generally possible to employ buffers in the traditional manner as discussed above with respect to FIG. 2. Instead, buffer (or other) devices may be used to provide electrical loads; where the size of a load (generally specified in picofarads) determines the delay introduced. Referring to FIG. 6, each fine delay path may include a common type of buffer element 600 such as an inverting buffer from Lucent Technologies (designated INRB) as part of their 2.5 volt, 0.25 micron CMOS standard cell library. Coupled to the output of each "input" buffer 600 are various loads 602, 604 and 606; each load designed/selected to introduce a specified delay. Illustrative loads 602, 604 and 606 include buffer devices (e.g., INRB devices), MUX units. In one embodiment, fine delay unit input buffers 600 are capable of providing a large amount of drive capability so that the delay produced by fine delay unit 308 is less susceptible to routing line lengths and more a function of the extrinsic delay generated by loads 602, 604 and 606.

Routing element 506 may be any device(s) capable of routing a specified one input signal (i.e., output from one of buffers 600) to an output port. For example, a single N-input MUX unit could act as router 506 for a fine delay unit having N input buffers 600. Alternatively, a plurality of smaller MUX units may be coupled in a tiered fashion to provide the same functionality. Loads 602, 604 and 606 may be custom designed to minimize the problems associated with different MUX legs having different delay characteristics. In addition, a custom layout for fine delay unit 308 may be performed. It is noted that while custom layout operations are generally time consuming, a delay circuit in accordance with the invention allows a designer to use automated design and layout tools for the coarse delay units (providing the majority of the delay circuit's delay), requiring an increased design effort for only a small portion of the delay circuit.

Referring again to FIG. 3, selection unit 310 provides a means to selectively route input signal 312 through one or more coarse delay units and fine delay unit 308. In accordance with standard design methodologies, selection unit 310 may be implemented in any desired fashion. In one embodiment, a decoder circuit implements selection unit 310. In another embodiment, selection unit 310 may comprise individual signal lines to control each coarse delay unit and fine delay unit's router 506. In yet another embodiment, a combination of these approaches may be used.

Figure 7:
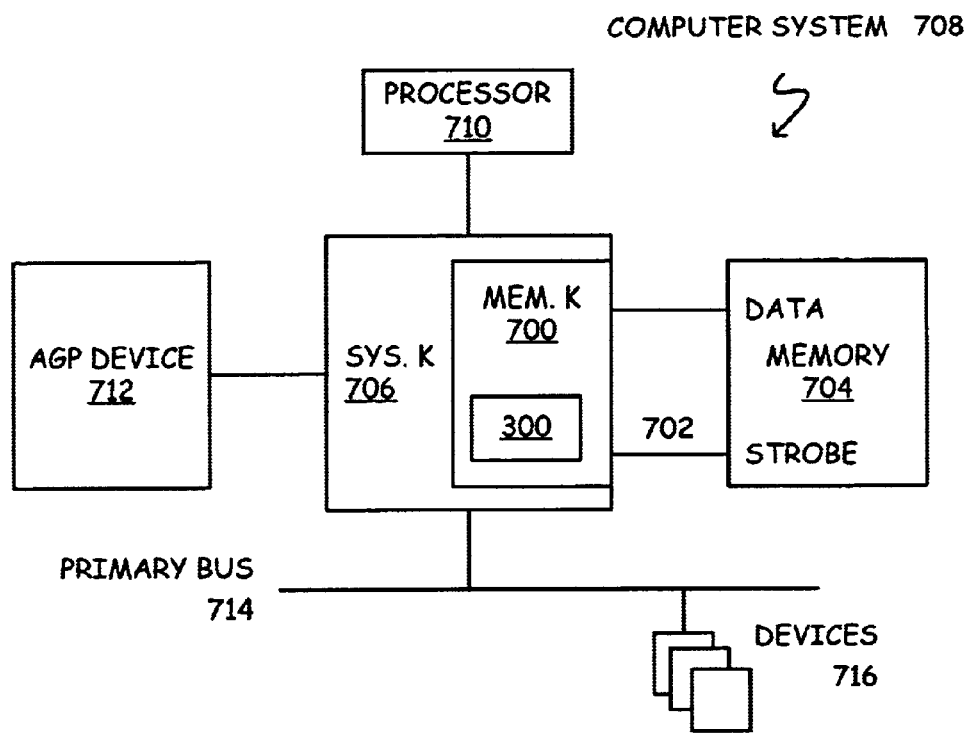
FIG. 7 shows a block diagram of a computer system incorporating a delay circuit in accordance with the invention.

Referring to FIG. 7, in one useful embodiment delay circuit 300 may be incorporated within DDR memory controller 700 to adaptively delay strobe signal 702 received from DDR memory 704 during memory read operations. As shown, memory controller 700 may itself be part of system controller 706 which, in turn, is part of computer system 708. Computer system 708 may also include processor 710, accelerated graphics port (AGP) device 712, primary bus 714, and primary bus devices 716 (e.g., modem, network interface controller, and audio and video controllers). Illustrative processors 710 include the PENTIUM® family of processors and the 80×86 families of processors from Intel Corporation of Santa Clara, Calif. An illustrative primary bus 714 is operated in conformance with the Peripheral Component Interconnect (PCI) bus standard as defined in the PCI Local Bus Specification, Production Version, Revision 2.1, dated 1995. AGP device 712 and associated system controller interface (not shown) may operate according to the Accelerated Graphics Port (AGP) Interface Specification, Revision 2.0, dated May 1998.

In contrast to prior art adjustable delay lines, a delay circuit in accordance with the invention provides coarse delay units (organized in series) coupled to a single fine delay unit having a plurality of parallel organized delay paths. This arrangement allows a design engineer to provide a relatively large overall signal delay (provided primarily by the coarse delay units), while also providing a fine temporal resolution (provided primarily by the fine delay unit). In addition, the design and layout of course delay units may be managed via automated tools to speed the design process. This, in turn, may significantly reduce the effort and time required to design an adjustable delay line. Further, while design of the fine delay unit may require custom layout, the number of individual delay paths in most cases is limited to a relatively small number (e.g., 3 or 8), making the overall design effort smaller than for conventional adjustable delay lines. Yet another benefit of the invention is that the insertion or setup time for adjustable delay circuit 300 (i.e., using chained coarse delay units and a shallow selection tree for fine delay unit 308) is generally much smaller than that of a conventional delay line using MUX trees to provide delay (for a given specified delay capability). This, in turn, makes it easier and faster to determine the data eye of a data signal during circuit initialization.

While the invention has been disclosed with respect to a limited number of embodiments, numerous modifications and variations will be appreciated by those skilled in the art. For example, use of delay circuit 300 is not limited to DDR memory interfaces or, even, to source-strobed interfaces. In addition, while the above description assumed delay circuit 300 was embodied in a custom design integrated circuit (e.g., an application specific integrated circuit or programmable gate array device), this limitation is not necessary. For example, delay circuit 300 may also be implemented using discrete components and field programmable gate array devices. It is intended, therefore, that the following claims cover all such modifications and variations that may fall within the true spirit and scope of the invention.

What is claimed is:

1. A programmable delay circuit, comprising:

a plurality of coarse delay stages coupled in series fashion; and a fine delay stage having a plurality of parallel organized delay paths, each of said plurality of delay paths adapted to receive input from a common coarse delay stage, each of said plurality of delay paths further adapted to delay a signal for a different specified amount of time, wherein each of said plurality of coarse delay stages is adapted to introduce a substantially equal delay, wherein each of said plurality of coarse delay stages comprises a multiplexer unit having plural inputs and an output, a first input of each of at least two of the multiplexer units to receive an output of another multiplexer unit in a previous coarse delay stage, and a second input of each of the at least two multiplexer units connected to a signal path separate from a path including the multiplexer units.

2. The programmable delay circuit of claim 1, wherein each of said plurality of parallel organized delay paths comprises a load, wherein the load is adapted to provide the delay of a specified amount of time.

3. The programmable delay circuit of claim 2, wherein each load is adapted to provide a delay of approximately 50 picoseconds different than the delay provided by another of said each load.

4. The programmable delay circuit of claim 2, wherein each load comprises one or more buffer devices.

5. The programmable delay circuit of claim 1, wherein each delay path is adapted to delay a signal for a time less than or equal to the delay provided by a coarse delay stage.

6. The programmable delay circuit of claim 1, further comprising a circuit adapted to selectively route a signal through the plurality of coarse delay stages and the plurality of parallel organized delay paths.

7. The programmable delay circuit of claim 1, wherein the signal path comprises a chain of buffers, the second input of one of the at least two multiplexer units connected to an output of one of the buffers, and the second input of another one of the at least two multiplexer units connected to an output of another one of the buffers.

8. A programmable delay circuit, comprising:

a plurality of coarse delay stages coupled in series fashion, each coarse delay stage having an input node, an output node and a select node, each coarse delay stage adapted to introduce a substantially equal delay in a signal supplied to the input node;

a plurality of fine delay stages, each fine delay stage having an input node, an output node and a load, wherein each fine delay stage input node is coupled to the output node of a first coarse delay stage; and a circuit adapted to selectively route an input signal through one or more of the plurality of coarse delay stages and to couple the output node of one of the fine delay stages to a delay circuit output node, wherein each of the coarse delay stages has a multiplexer having plural inputs and an output, a first input of each of at least two of the multiplexers to receive an output of another multiplexer in a previous coarse delay stage, and a second input of each of the at least two multiplexers coupled to a signal path separate from a path including the multiplexers.

9. The programmable delay circuit of claim 8, wherein each of said plurality of loads is adapted to provide a signal delay of a specified amount of time.

10. The programmable delay circuit of claim 9, wherein each load is adapted to provide a delay of approximately 50 picoseconds different than the delay provided by another of said each load.

11. The programmable delay circuit of claim 10, wherein the load comprises one or more buffer devices.

12. The programmable delay circuit of claim 8, wherein the signal path comprises a chain of buffers, the second input of one of the at least two multiplexers connected to an output of one of the buffers, and the second input of another one of the at least two multiplexers connected to an output of another one of the buffers.

13. A computer system, comprising:

a processor;

a system memory; and a memory controller coupled to the processor and the system memory, the memory controller including an adjustable delay circuit operatively coupled to the system memory, the adjustable delay circuit having a plurality of coarse delay stages coupled in series fashion, wherein each of the plurality of coarse delay stages is adapted to introduce a substantially equal delay; and a fine delay stage having a plurality of parallel organized delay paths, each of said plurality of delay paths adapted to receive input from a common coarse delay stage, each of said plurality of delay paths further adapted to delay a signal for a different specified amount of time, wherein each of the coarse delay stages has a multiplexer having plural inputs and an output, a first input of each of at least two of the multiplexers to receive an output of another multiplexer in a previous coarse delay stage, and a second input of each of the at least two multiplexers coupled to a signal path separate from a path including the multiplexers.

14. The computer system of claim 13, wherein the adjustable delay circuit is adapted to receive a strobe signal from the system memory.

15. The computer system of claim 13, wherein the system memory comprises double data rate dynamic random access memory.

16. The computer system of claim 13, wherein each of said plurality of delay paths comprises a load device, the load device adapted to delay the signal for the specified amount of time.

17. The computer system of claim 16, wherein each load device comprises one or more buffer devices.

18. The computer system of claim 13, wherein the signal path comprises a chain of buffers, the second input of one of the at least two multiplexers connected to an output of one of the buffers, and the second input of another one of the at least two multiplexers connected to an output of another one of the buffers.

19. A method to delay a signal, comprising:

receiving the signal;

routing the signal through plural coarse delay units to generate an intermediate signal, each of the coarse delay units to introduce a substantially equal delay, the coarse delay units coupled in series fashion, wherein routing the signal through the plural coarse delay units comprises routing the signal through plural multiplexers each having plural inputs and an output, a first input of each of at least two of the multiplexers to receive an output of another multiplexer in a previous coarse delay unit, and a second input of each of the at least two multiplexers coupled to a signal path separate from a path including the multiplexers; and selectively routing the intermediate signal through one of a plurality of fine delay units to generate a delayed signal, the fine delay units coupled in parallel fashion, each of the fine delay units having an input coupled to a common one of the coarse delay units.

20. The method of claim 19, wherein the act of routing the signal through plural coarse delay units generates the intermediate signal having a delay, relative to the signal, approximately equal to a specified time delay multiplied by the number of coarse delay units the signal is routed through.

21. The method of claim 19, wherein the act of selectively routing the intermediate signal through one of the plurality of fine delay units introduces a delay to the intermediate signal that is different for each of the plurality of fine delay units.

22. The method of claim 19, wherein the act of selectively routing the intermediate signal through one of the plurality of fine delay units introduces a delay to the intermediate signal which is less than the delay introduced into the signal by a coarse delay unit.

* * * * *